VOLTAGE CONTROLLED FREE-RUNNING FLIP-FLOP OSCILLATOR

Filed Jan. 26, 1966 2 Sheets-Sheet 1

INVENTOR.
JOHN L. WAY
BY Arthur Freilich
Samuel Lindenberg
ATTORNEYS

VOLTAGE CONTROLLED FREE-RUNNING FLIP-FLOP OSCILLATOR

Filed Jan. 26, 1966 2 Sheets-Sheet 2

INVENTOR.
JOHN L. WAY
BY Arthur Freilich
Samuel Lindenberg
ATTORNEYS

United States Patent Office 3,328,724

Patented June 27, 1967

3,328,724

VOLTAGE CONTROLLED FREE-RUNNING FLIP-FLOP OSCILLATOR

John L. Way, 2011 Tulip Tree Lane, La Canada, Calif. 91011

Filed Jan. 26, 1966, Ser. No. 523,071

8 Claims. (Cl. 331—113)

This invention relates to an improved voltage controlled oscillator whose frequency can be accurately varied over an extremely wide range.

The prior art is replete with various voltage controlled oscillator circuits, all of which are capable of providing an output signal whose frequency is varied in response to amplitude variations of an input voltage. While each of these circuits is likely useful in an appropriate application, most possess certain inherent limitations which make them unsuitable for other applications. For example, some circuits are capable of providing accurate frequencies only over a very limited range. Other circuits are unduly complex and therefore relatively expensive and unreliable. Still others circuits have other undesired limitations.

In view of the foregoing, it is an object of the present invention to provide an improved voltage controlled oscillator capable of providing an accurate output frequency over a very wide range.

Briefly, in accordance with the present invention, a voltage controlled oscillator is provided including a current source capable of providing a constant current having an amplitude substantially linearly related to the amplitude of a voltage input signal. A means is provided for developing the time integral of the current which is compared with a threshold voltage signal. When the integral exceeds the threshold signal, a flip-flop is switched, e.g. to its second state, and the development of a new time integral is initiated. When this new time integral exceeds the threshold signal, the flip-flop is switched back to its first state. Thus, the flip-flop will oscillate at a rate determined by the amplitude of the constant current which in turn of course is determined by the amplitude of the voltage input signal.

A significant feature of the invention includes the provision of a starter circuit which monitors the flip-flop and in response to the flip-flop not oscillating, pulses the constant current source to thereby tend to initiate oscillations.

Inasmuch as the frequency of oscillation depends upon both a voltage input signal and a threshold voltage signal, a circuit in accordance with the present invention is able to provide an output signal whose frequency is related to the ratio of the amplitudes of the two different voltage signals.

The novel features that are considered characteristic of this invention are set forth with particularity in the appended claims. The inveniton itself will best be understood from the following description when read in connection with the accompanying drawings, in which:

Figures 1, 3:
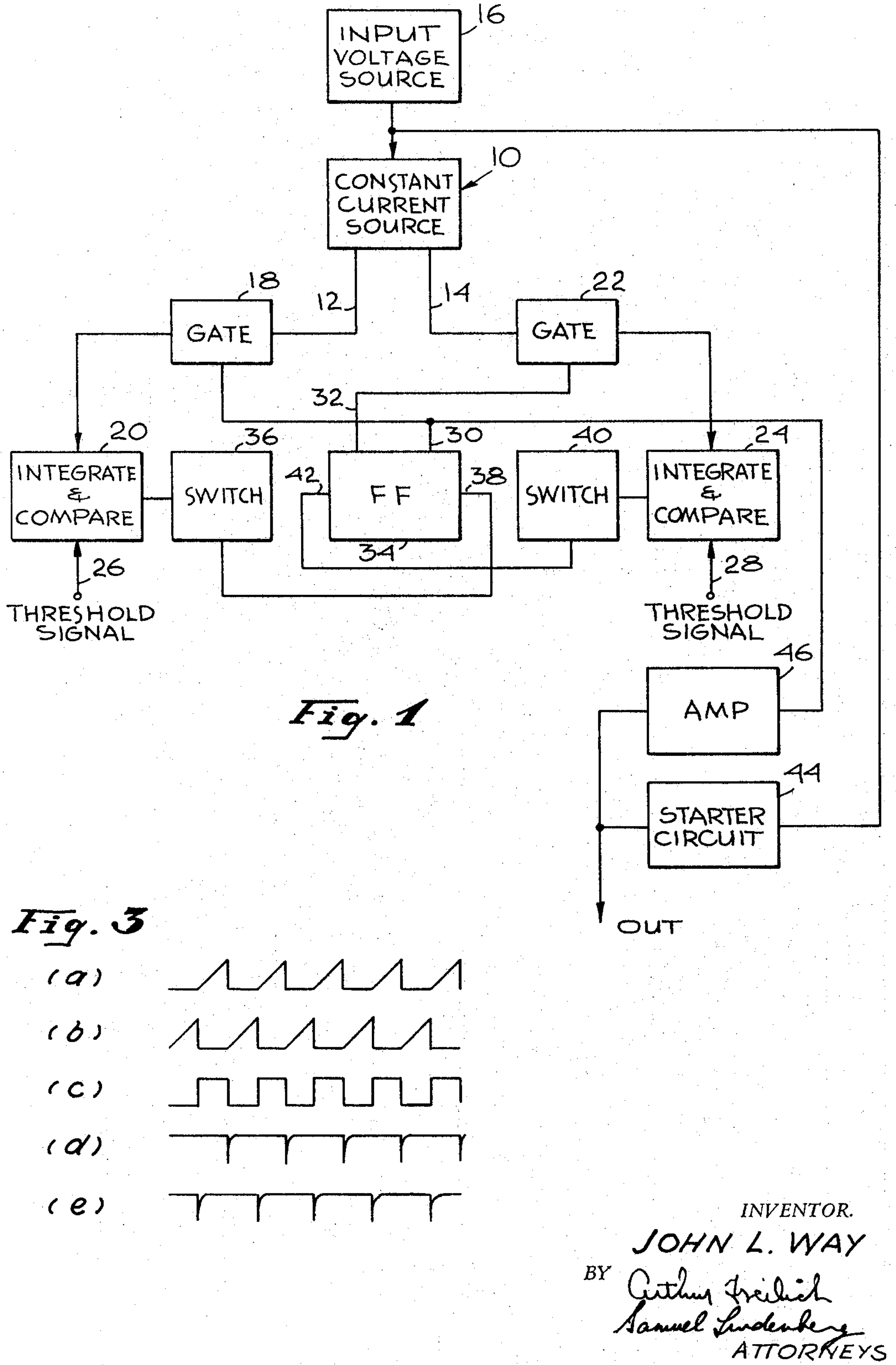
FIGURE 1 is a block diagram of a voltage controlled oscillator constructed in accordance with the present invention.
FIGURES 3(*a*) to (*e*) illustrate significant waveforms, each appearing at a different designated point in the circuit of FIGURE 2.

Attention is now called to FIGURE 1 which illustrates a block diagram of a voltage controlled oscillator constructed in accordance wtih the present invention. The oscillator includes a constant current source 10 which provides a constant output current on both output terminals 12 and 14 whose amplitude is determined by the amplitude of a voltage input signal provided by source 16. Output terminal 12 is connected to the input of a gate 18 whose output is connected to the input of an integrate and compare circuit 20. The output terminal 14 on the other hand is connected to the input of gate 22 whose output is connected to the input of an integrate and compare circuit 24.

A first threshold signal is applied to the integrate and compare circuit 20 via conductor 26 and a second threshold signal is applied to the integrate and compare circuit 24 via a conductor 28. For conventional voltage controlled oscillator applications, the threshold signals applied to conductors 26 and 28 can in fact constitute the same signal.

The gates 18 and 22 are respectively controlled by output terminals 30 and 32 of flip-flop 34. That is, when the flip-flop defines a first state, output terminal 30 enables gate 18 to thereby apply a constant current from source 10 to the integrate and compare circuit 20. On the other hand, when flip-flop 34 defines a second state, gate 22 is enabled to thus provide the constant current from source 10 to the integrate and compare circuit 24. Each integrate and compare circuit 20 and 24 develops a time integral of the current applied thereto and compares the time integral with the threshold signal. When the time integral developed by circuit 20 exceeds the threshold signal applied to conductor 26, a switching circuit 36 is actuated. The switching circuit 36 in turn applies a pulse to input terminal 38 of flip-flop 34 to thereby switch the flip-flop to its second state, thus enabling gate 22 and causing the circuit 24 to initiate the development of the time integral of the constant current. When this time integral exceeds the threshold signal applied to conductor 28, switching circuit 40 is energized to thereby apply a pulse to flip-flop input terminal 42 thus switching the flip-flop back to its first state.

Accordingly, it should be appreciated that the flip-flop 34 will oscillate between its first and second states at a rate determined both by the levels of the threshold signals and by the amplitude of the constant current provided by source 10. The amplitude of the constant current is of course in turn determined by the amplitude of the voltage input signal supplied by source 16.

In order to assure that oscillations are initiated, a starter circuit 44 is provided. The input to the starter circuit 44 is connected to the output of an amplifier 46 whose input is in turn connected to the output of the flip-flop 34. As will be better appreciated hereinafter, so long as the flip-flop 34 is oscillating, the amplifier 46 will hold the starter circuit 44 off. However, if the flip-flop 34 is not oscillating, then the starter circuit 44 will periodically apply pulses to the constant current source 10 tending to initiate oscillations in the flip-flop.

Figure 2:
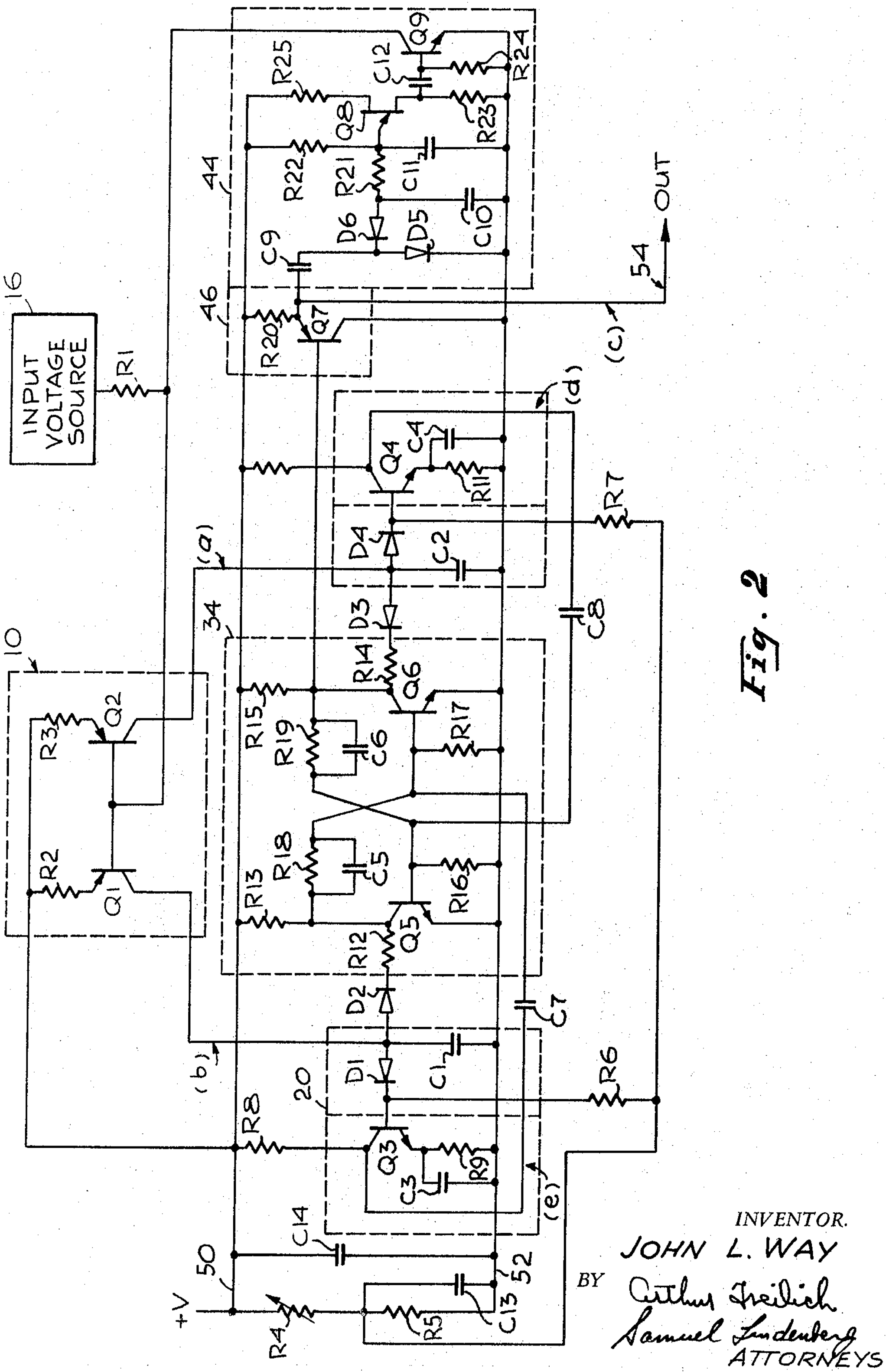
FIGURE 2 is a schematic diagram of a preferred embodiment of the voltage controlled oscillator of FIGURE 1.

Attention is now called to FIGURE 2 which schematically illustrates a preferred embodiment of the present invention. The constant current source 10 is comprised of first and second PNP transistors Q1 and Q2. The bases of transistors Q1 and Q2 are connected together and through a resistor R1 to the input voltage source 16. The emitters of transistors Q1 and Q2 are respectively connected through resistors R2 and R3 to a positive potential bus 50. For purposes of illustration, it will be assumed that a positive potential of 18 volts is applied to the positive potential bus 50. A ground potential bus 52 is also provided.

The collectors of transistors Q1 and Q2 respectively are connected to the integrate and compare circuits 20 and 24. More particularly, the collector of transistor Q1 is connected to the upper terminal of capacitor C1 whose lower terminal is connected to the ground bus 52. The upper terminal of capacitor C1 is connected to the anode of diodes D1 and D2. Similarly, the collector of transistor Q2 is connected to the upper terminal of capacitor C2 whose lower terminal is connected to the ground bus 52. The upper terminal of capacitor C2 is connected to the anodes of diodes D3 and D4.

A voltage divider comprised of a variable resistor R4 and a fixed resistor R5 in parallel with capacitor C13, is connected between the positive potential bus 50 and ground bus 52. The junction between resistors R4 and R5 is connected through resistors R6 and R7 to the cathodes of diodes D1 and D4 respectively. Capacitor C1 develops the time integral of the constant current provided by transistor Q1. The diode D1 effectively compares the threshold signal applied to its cathode with the time integral of the constant current applied to its anode and becomes forward biased only when the time integral exceeds the threshold. Diode D4 similarly compares the time integral of the constant current provided by transistor Q2 with the threshold signal.

The cathode of diode D1 is connected to the base of NPN transistor Q3. The collector of transistor Q3 is connected through resistor R8 to the positive potential bus. The emitter of transistor Q3 is connected through bias resistor R9 and capacitor C3, connected in parallel, to the ground bus. Similarly, the cathode of diode D4 is connected to the base of NPN transistor Q4 whose collector is connected through resistor R10 to the positive potential bus 50 and whose emitter is connected through bias resistor R11 and capacitor C4, connected in parallel, to the ground bus 52.

The flip-flop circuit 34 comprises a substantially conventional Eccles-Jordan circuit including NPN transistors Q5 and Q6. The collector of transistor Q5 is connected through current limiting resistor R12 to the cathode of diode D2 and through resistor R13 to the positive potential bus. The emitter of transistor Q5 is connected to the ground bus. Similarly, the collector of transistor Q6 is connected through current limiting resistor R14 to the cathode of diode D3 and through resistor R15 to the positive potential bus. The emitter of transistor Q6 is also connected to the ground bus 52. The bases of transistors Q5 and Q6 are respectively connected through bias resistors R16 and R17 to the ground bus. Parallel resistance capacitance coupling circuits connect the collector of each of the transistors Q5 and Q6 to the base of the other transistor. More particularly, a parallel circuit comprised of resistor R18 and capacitor C5 connects the collector of transistor Q5 to the base of transistor Q6. Resistor R19 and capacitor C6 connect the collector of transistor Q6 to the base of transistor Q5.

The collector of transistor Q3 is connected through capacitor C7 to the base of transistor Q6. Similarly, the collector of transistor Q4 is connected through capacitor C8 to the base of transistor Q5.

In the operation of the portion of the circuit thus far described, the input voltage source 16 provides a potential to the bases of transistors Q1 and Q2 causing current flow in the emitter collector circuits thereof. Inasmuch as the current in the emitter collector path of a transistor is substantially independent of the emitter collector voltage thereacross, the collectors of transistors Q1 and Q2 will provide a substantially constant current regardless of any potential build up at the collectors.

Let it initially be assumed that the flip-flop 34 defines a first state in which transistor Q6 is conducting and transistor Q5 is held off. As a consequence, the current from the collector of transistor Q2 will be steered through diode D3 and resistor R14 through transistor Q6 to ground bus 52. Accordingly, the junction between diodes D3 and D4 will be held at a low potential and the diode D4 will therefore be backbiased by the threshold signal applied to its cathode. On the other hand, the current from the collector of transistor Q1 will charge the capacitor C1 inasmuch as it cannot be steered through nonconducting transistor Q5. Capacitor C1 will charge linearly (as shown in FIGURE 3, line *b*), rather than exponentially, as a consequence of the charging current being constant. The capacitor C1 therefore truly develops the time integral of the constant current. The time integral is of course manifested by the voltage appearing on the upper terminal of the capacitor C1. When this voltage exceeds the threshold potential applied to the cathode of diode D1 by resistor R6, diode D1 will become forward biased to thus increase the current flow through transistor Q3. As a consequence, the potential on the collector of transistor Q3 will drop. Capacitor C7 will therefore couple a negative pulse to the base of transistor Q6 to cut it off (FIGURE 3, line *e*). The resulting rising potential on the collector of transistor Q6 will forward bias transistor Q5 to thus switch the flip-flop 34 to its second state. Thereafter, capacitor C1 will discharge through diode D2, resistor R12 and transistor Q5 while capacitor C2 will charge linearly (as shown in FIGURE 3, line *a*) until it exceeds the level of the threshold signal applied to the cathode of diode D4. When this happens, of course, transistor Q4 will conduct an increased current consequently cutting off transistor Q5 and returning the flip-flop 34 to its first state.

Resistors R12 and R14 are provided to limit the discharge current through the transistors Q5 and Q6 respectively from the capacitors C1 and C2. In the absence of the resistors R12 and R14, excessive discharge currents could easily flow through the transistors Q5 and Q6 thus tending to considerably shorten their useful life. Capacitor C14 is provided to decouple the current surges through R6 from R7 and conversely. Cacapitor C13 assures that the impedance of bus 50 remains low at very high frequencies.

From what has been said thus far, it should be appreciated that the flip-flop 34 will oscillate between its first and second states at a rate determined both by the amplitude of the voltage provided by input source 16 and by the threshold level established by the variable resistor R4. Accordingly, the circuit will oscillate at a rate determined by the ratio of the threshold voltage level to the input voltage.

The collector of the transistor Q6 is connected to the base of a PNP transistor Q7 in the output amplifier 46. The transistor Q7 is connected in an emitter follower arrangement with the emitter being connected through resistor R20 to the positive potential bus 50. The collector of transistor Q7 is connected to the ground bus 52. The emiter of transistor Q7 constitutes the output terminal 54 of the oscillator.

In order to insure that the circuit will oscillate upon the application of direct current power to the positive potential bus 50, the starter circuit 44 is provided. The starter circuit 44 includes a capacitor C9 connected between the emitter of transistor Q7 and the anode of diode D5. The cathode of diode D5 is connected to the ground bus 52. The anode of diode D5 is connected to the cathode of diode D6 whose anode is connected through capacitor C10 to the ground bus 52. The anode of diode D6 is connected through a resistor R21 to the emitter of a unijunction transistor Q8. The emitter of transistor Q8 is connected to the positive potential bus 50 through resistor R22 and to the ground bus 52 through capacitor C11. The two additional terminals of the unijunction transistor Q8 are respectively connected through resistor R25 to the positive potential bus 50 and through resistor R23 to the ground bus 52. The junction between the transistor Q8 and the resistor R23 is connected through capacitor C12 to the base of switching transistor Q9. The emitter of transistor Q9 is connected directly to the ground bus 52 while the collector thereof is connected to the bases of transistors Q1 and Q2 of the constant current source 10. Resistor R24 connects the base of transistor Q9 to the ground bus 52.

Assume for the moment that the flip-flop 34 is not oscillating. As a consequence, there will be no significant charge build up across capacitor C10. Thus the unijunction transistor Q8 will act as a relaxation oscillator. That is, the charge across capacitor C11 will tend to build up and thus forward bias the transistor Q8 thereby discharging capacitor C11 to subsequently cut off transistor Q8 and start the capacitor C11 charging again. As long as transistor Q8 oscillates, positive pulses will be coupled by capacitor C12 to the base of transistor Q9. Accordingly, transistor Q9 will periodicaly couple the bases of transistors Q1 and Q2 to the ground bus 52 thereby tending to pulse jar the constant current source 10 into conduction. The resistor R1 isolates the transistor Q9 from the source 16.

Now assume that the flip-flop 34 is oscillating. As a consequence, transistor Q7 will periodically be turned on and off meaning that the potential appearing at its emitter will fluctuate between substantially the potential of the positive potential bus 50 and ground. When the potential on the emitter of transistor Q7 is substantially at the positive potential, current will flow through the capacitor C9 and through the diode D5 in the forward direction. When transistor Q7 then conducts, capacitor C9 will tend to discharge through transistor Q7 and remove charge from capacitor C10 through diode D6. As a consequence, a negative potential will be quickly built up at the upper terminal of capacitor C10 which will hold the unijunction transistor off. Thus, so long as the flip-flop circuit 34 is oscillating, the unijunction transistor Q8 and switching transistor Q9 and associated circuitry do not affect the performance of the flip-flop 34. Moreover, the emitter follower circuit including transistor Q7 presents a high impedance to the flip-flop 34 thereby assuring that its presence does not upset the symmetry of the two halves of the flip-flop. In addition, transistor Q7 connected as shown has a very fast rise and fall time thereby providing an essentially square wave output (FIGURE 3, line *c*).

From the foregoing, it should be appreciated that a voltage controlled oscillator has been shown herein in which the frequency of oscillation is determined by a comparison between a time integral preferably developed across a capacitor and a threshold signal. The time integral is developed by providing a constant current to the capacitor to thereby charge it linearly rather than exponentially. Exponential charging would limit the useful frequency range to the linear portion of the exponential curve. Linear charging, on the other hand, provides a much wider frequency range; e.g. embodiments of the invention are capable of providing frequencies over a range in which the upper frequency limit is over 200 times the lower frequency limit. Although values of selected components shown in FIGURE 2 are hereinafter set forth, it should be understood that these are exemplary only and are provided to facilitate an understanding of the invention rather than to limit its scope. Thus, it is recognized that other embodiments and variations of the invention will occur to those skilled in the art falling within the scope of the appended claims.

| | | |
|---|---|---|
| R1 | ohms | 10K |
| R2 | do | 2K |
| R3 | do | 2K |
| R4 | do | 11K |
| R5 | do | 3.9K |
| R6 | do | 1K |
| R7 | do | 1K |
| R8 | do | 4.7K |
| R9 | do | 3.0K |
| R10 | do | 4.7K |
| R11 | do | 3.9K |
| R12 | do | 10 |
| R13 | do | 3.6K |
| R14 | do | 10 |
| R15 | do | 3.6K |
| R16 | do | 10K |

| | | |
|---|---|---|
| R17 | do | 10K |
| R18 | do | 30K |
| R19 | do | 30K |
| R20 | do | 4.7K |
| R21 | do | 330K |
| R22 | do | 110K |
| R23 | do | 1K |
| R24 | do | 10K |
| R25 | do | 330 |
| C1 | picofarads | 1000 |
| C2 | do | 1000 |
| C3 | microfarads | 2.2 |
| C4 | do | 2.2 |
| C5 | picofarads | 33 |
| C6 | do | 33 |
| C7 | microfarads | 0.01 |
| C8 | do | 0.01 |
| C9 | do | 2.2 |
| C10 | do | 2.2 |
| C11 | do | .001 |
| C12 | do | .001 |
| C13 | do | 15 |
| C14 | do | 15 |

What is claimed is:

1. A voltage controlled oscillator comprising:
means providing a voltage input signal;
means responsive to said voltage input signal for providing a constant current having an amplitude related to the amplitude of said input signal;
first and second integrating means;
a flip-flop capable of defining first and second states;
means responsive to said flip-flop defining said first state for causing said first integrating means to develop the time integral of said constant current;
means responsive to said flip-flop defining said second state for causing said second integrating means to develop the time integral of said constant current;
means defining first and second threshold levels;
means comparing said time integral developed by said first integrating means with said first threshold level and switching said flip-flop to said second state when said threshold level is exceeded; and
means comparing said time integral developed by said second integrating means with said second threshold level and switching said flip-flop to said first state when said threshold level is exceeded.

2. The voltage controlled oscillator of claim 1 wherein said means for providing said constant current includes first and second transistors each having a base, an emitter, and a collector;
a source of reference potential;
first and second impedance means respectively coupling said first and second transistor emitters to said source of reference potential; and
means coupling said input signal to the bases of said first and second transistors.

3. The voltage controlled oscillator of claim 2 wherein said first integrating means includes a first capacitor having a first terminal connected to a second source of reference potential and a second terminal connected to said first transistor collector; and wherein
said second integrating means includes a second capacitor having a first terminal connected to said second source of reference potential and a second terminal connected to said second transistor collector.

4. The voltage controlled oscillator of claim 3 wherein said means comparing said time integral developed by said first integrating means with said first threshold potential includes a first diode connected between said first capacitor second terminal and said means defining said first threshold level; and wherein
said means comparing said time integral developed by said second integrating means with said second threshold potential includes a second diode connected between said second capacitor second terminal and said means defining said second threshold level.

5. The voltage controlled oscillator of claim 4 wherein said means switching said flip-flop to said second state includes a first transistor switch responsive to said first diode being forward biased and a second transistor switch responsive to said second diode being forward biased.

6. The voltage controlled oscillator of claim 5 including oscillator means;

means responsive to said flip-flop oscillating for inhibiting oscillation in said oscillator means; and means responsive to said oscillating means oscillating for applying pulses to said bases of said first and second transistors for initiating said constant current.

7. The voltage controlled oscillator of claim 6 wherein said means responsive to said flip-flop oscillating includes an emitter follower circuit having a control terminal and an output terminal;

means connecting said control terminal to the output of said flip-flop for forward biasing said emitter follower in response to one of said flip-flop states;

first capacitor means connected to said output terminal;

first and second rectifier means connected to said first capacitor means for respectively permitting current flow in opposite directions therethrough; and second capacitor means connected in series with said second rectifier means for inhibiting oscillation in said oscillator means.

8. The voltage controlled oscillator of claim 1 including means for monitoring said flip-flop to determine whether or not it is oscillating; and means for pulsing said means for providing said constant current in the event said flip-flop is not oscillating.

References Cited

UNITED STATES PATENTS

| | | | |
|---|---|---|---|
| 2,879,412 | 3/1959 | Hoge et al. | 331—113 X |
| 2,924,788 | 2/1960 | Maurushat | 307—88.5 X |
| 2,949,582 | 8/1960 | Silliman | 331—113 |
| 3,259,854 | 7/1966 | Marcus et al. | 331—111 |

ROY LAKE, *Primary Examiner.*

S. H. GRIMM, *Assistant Examiner.*